(12) United States Patent
Kadin

(10) Patent No.: US 8,055,318 B1
(45) Date of Patent: Nov. 8, 2011

(54) SUPERCONDUCTING INTEGRATED CIRCUIT TECHNOLOGY USING IRON-ARSENIC COMPOUNDS

(75) Inventor: Alan M. Kadin, Princeton Junction, NJ (US)

(73) Assignee: Hypres, Inc., Elmsford, NY (US)

( * ) Notice: Subject to any disclaimer, the term of this patent is extended or adjusted under 35 U.S.C. 154(b) by 664 days.

(21) Appl. No.: 12/428,202

(22) Filed: Apr. 22, 2009

Related U.S. Application Data

(60) Provisional application No. 61/047,373, filed on Apr. 23, 2008.

(51) Int. Cl.
*H01L 39/22* (2006.01)

(52) U.S. Cl. ........ 505/190; 505/329; 505/237; 505/238; 505/702; 505/817; 257/31; 257/32; 257/33; 257/E39.014; 428/704; 428/930; 427/62

(58) Field of Classification Search .................. 505/190, 505/237, 238, 329, 702, 817, 832, 861, 864; 257/31–36, E39.014; 365/106–162; 326/2–5; 428/697–702, 704
See application file for complete search history.

(56) References Cited

U.S. PATENT DOCUMENTS

| | | | |
|---|---|---|---|
| 5,468,973 A * | 11/1995 | Harada et al. .................. 257/33 |
| 5,885,937 A * | 3/1999 | Adachi et al. ................. 505/190 |
| 6,066,600 A * | 5/2000 | Chan ............................. 505/329 |
| 6,375,761 B1 * | 4/2002 | Gambino et al. ............. 148/301 |

FOREIGN PATENT DOCUMENTS

JP   2007-320829   * 12/2007

OTHER PUBLICATIONS

Yamamoto et al, "Evidence of two distinct scales of current flow in polycrystalline Sm and Nd iron oxypnictides," Superconduct. Sci. Technol, 2008, V21, 095008 (11pp).*

Narduzzo et al, "Uppercritical field, penetration depth, and depinning frequency of the high temperature superconductor LaFeAsO0.9F0.1 studied by microwave surface impedance," Physical Review B, 2008,V 78, 012507.*

Y. Kamihara, et al., "Iron-Based Layered Superconductor La[O1-xFx]FeAs (x=0.05-0.12) with Tc=26 K", Communications of the American Chemical Society, vol. 130, pp. 3296-3297 (2008).

Z. Ren, et al., "Novel Superconductivity and Phase Diagram in the Iron-based Arsenic-oxides RFeAsO1-d (R = rare earth metal) without F-Doping", arxiv.org/abs/0804.2582, published in Europhysics Letters, vol. 83, p. 17002, Jul. 2008.

M. Rotter, et al., "Superconductivity at 38 K in the Iron Arsenide Ba1-xKxFe2As2", Phys Rev Lett vol. 101, p. 107006 (2008).

(Continued)

*Primary Examiner* — Stuart Hendrickson
*Assistant Examiner* — Kallambella Vijayakumar
(74) *Attorney, Agent, or Firm* — Steven M. Hoffberg; Ostrolenk Faber LLP

(57) ABSTRACT

A new family of superconducting materials with critical temperature up to 55 K have recently been discovered, comprising a crystal structure with atomic layers of iron and arsenic alternating with atomic layers of rare-earth oxide or alkaline earth. The present invention identifies structures for integrated circuit elements (including Josephson junctions) in these and related materials. These superconducting circuit elements will operate at a higher temperature than low-temperature superconductors such as niobium, and may be easier to manufacture than prior-art high-temperature superconductors based on copper-oxides.

16 Claims, 5 Drawing Sheets

OTHER PUBLICATIONS

C.W. Chu, et al., "Synthesis and Characterization of LiFeAs and NaFeAs", preprint to ArXiv database, arXiv:0902.0806, submitted Feb. 2009.

S. Margadonna, et al., "Pressure evolution of low-temperature crystal structure and bonding of 37 K Tc FeSe superconductor", preprint to ArXiv database, arXiv:0903.2204v1, submitted Mar. 2009.

H. Hiramatsu, et al., "Superconductivity in Epitaxial Thin Films of Co-Doped $SrFe_2As_2$ with Bilayered FeAs Structures and their Magnetic Anisotropy", Applied Physics Express, vol. 1, p. 101702 (2008).

* cited by examiner

SUPERCONDUCTING INTEGRATED CIRCUIT TECHNOLOGY USING IRON-ARSENIC COMPOUNDS

BACKGROUND OF THE INVENTION

Thin-film devices based on superconducting materials have demonstrated superior performance for many applications. However, they will function properly only at deep cryogenic temperatures, below the critical temperature $T_c$ of the given superconducting material. Conventional low-temperature superconductors (LTS) have been known for almost 100 years, and thin-film circuits based on the metallic element niobium (Nb) can be built around active devices known as Josephson junctions (JJ). These junctions form the basis for active superconducting electronic elements, both analog and digital. More specifically, large numbers of JJs can be integrated together using an ultra-fast circuit low-power technology known as RSFQ (rapid-single-flux-quantum) logic, which has provided digital integrated circuits (ICs) that are clocked at 100 GHz or more. However, these Nb-based circuits require cooling to below $T_c$=9 K to function. This is technologically feasible using closed-cycle refrigerators known as cryocoolers, but operation at higher temperatures would tend to have improved power efficiency and easier system packaging.

LTS Nb circuits are comprised of polycrystalline thin films, fabricated on an ambient-temperature substrate by sputtering techniques and patterned into ICs. The structure typically includes several superconducting wiring layers, separated by thick insulating layers. It also include Josephson junctions (JJs), typically comprised of an SIS tunnel-junction trilayer, with a thin insulator I (of order 1 nm thick) separating two superconducting S layers. This permits weak electronic tunneling between the two superconducting layers that may be modulated by magnetic field or voltage.

In 1986 and 1987, a new class of "high-temperature superconducting" (HTS) materials was discovered, based on a crystal structure with parallel copper-oxide (cuprate) planes. The most practical material of this class is $YBa_2Cu_3O_7$ (also known as YBCO), with $T_c$=92 K. Unfortunately, conduction in YBCO and related cuprate materials is highly anisotropic, with severe problems conducting across grain boundaries. For this reason, practical IC processes require multi-layer thin films that are highly epitaxial with few grain boundaries or other defects, and are practically single crystals. That, combined with the high fabrication temperatures (>700° C.) needed to assure crystalline quality, makes device fabrication difficult. While simple RSFQ circuits operating at high speeds have been demonstrated in the laboratory, it has proven very difficult to develop a reliable IC process for YBCO.

An SIS structure for YBCO is not compatible with the high-temperature processing, since the barrier is too thin to maintain its integrity. An alternative JJ structure in the prior art is SNS, where N refers to a non-superconducting resistive material, which may be from 10 to 100 nm thick, depending on the material. See, for example, U.S. Pat. No. 5,468,973. For YBCO superconductors, SNS junctions have been made with horizontal ramp-edge structures, due to the anisotropy of conduction in the cuprate films. See, for example, U.S. Pat. No. 6,066,600. However, it has been difficult to develop a uniform process for YBCO JJs compatible with high-density ICs.

Researchers have continued to search for alternative materials that may exhibit superconductivity at relatively high temperatures (perhaps even exceeding the cuprates), but may also be easier to fabricate and process. Very recently, a material was fabricated having a crystal structure shown in FIG. 1A, comprised of atomic layers of iron-arsenic (FeAs) alternating with atomic layers of rare-earth oxides, with composition such as LaFeAsO. Superconductivity in this compound with $T_c$=26 K was first reported by Kamihara at the end of February 2008, by partially substituting fluorine for oxygen to "dope" the material with carriers. Y. Kamihara, et al., "Iron-Based Layered Superconductor $La[O_{1-x}F_x]FeAs$ (x=0.05-0.12) with $T_c$=26 K", J. Am. Chem. Soc., 130 (11), 3296-3297, Feb. 23, 2008. pubs.acs.org/cgi-bin/abstract.cgi/jacsat/2008/130/ill/abs/ja800073m.html (expressly incorporated herein by reference). Subsequent research in China in March and April (Ren, et al.) verified these findings and achieved T, up to 55 K by substitution of another rare-earth element samarium (Sm) for lanthanum (La). Z. A. Ren, et al., "Novel Superconductivity and Phase Diagram in the Iron-based Arsenic-oxides $RFeAsO_{1-\delta}$ (R=rare earth metal) without F-Doping", preprint submitted on Apr. 16, 2008. arxiv.org/abs/0804.2582, published in Europhysics Letters, vol. 83, p. 17002, July 2008 (expressly incorporated herein by reference). Within this application, all these materials are collectively identified as RFAO, where R refers to one of the rare-earth elements (as described further below). Research exploring further substitutions that may increase $T_c$ even further are continuing worldwide.

It is believed that the superconductivity is associated with conduction in the parallel Fe layers, which would be expected to exhibit anisotropic behavior, similar to that in YBCO and related cuprates. It is somewhat surprising that the superconductivity is associated with Fe atoms, since it is well known in the prior art that Fe atoms are generally magnetic, and that magnetic atoms generally degrade superconductivity.

Following the initial series of discoveries, several other closely related families of superconductors were discovered. The initial RFAO materials are sometimes referred to as "1111" compounds, for the ideal stoichiometries of the crystal structure. Another family is identified as "122", with ideal structure $AeFe_2As_2$, with Ae refers to alkaline earth atoms such as Ba, Sr, and Ca. See, for example, M. Rotter, et al., "Superconductivity at 38 K in the Iron Arsenide $(Ba_{1-x}K_x)Fe_2As_2$", Physical Review Letters, vol. 101, p. 107006, September 2008 (expressly incorporated herein by reference). Again, this consists of FeAs layers, separated by Ae layers (see FIG. 1B). These 122 materials exhibit a superconducting critical temperature as high as 38 K, and generally need to be doped by substitution, either of alkalai atoms (K, Na) on the Ae site (for hole doping) or of Co atoms on the Fe site (for electron doping). There is also a "111" family with general formula AFeAs, with A an alkali atom (Li or Na), with $T_c$ up to 25 K. See, for example, C. W. Chu, et al., "Synthesis and characterization of LiFeAs and NaFeAs", arxiv.org/abs/0902.0806, submitted February 2009 (expressly incorporated herein by reference). In all cases, the superconductivity seems to be associated with the Fe layers.

While the RFAO (1111) materials still exhibit the highest values of $T_c$ of the FeAs families (around 56 K as of April 2009), the other families of materials may still be of interest if they offer advantages in materials processing or other properties such as device reproducibility.

Finally, another family of superconductors that may be closely related to the FeAs compounds has recently been reported, based on FeSe, where other chalcogenides (S and Te) may be substituted on the Se site. Although the superconducting critical temperatures of these materials at ambient pressure are modest (~10 K), large hydrostatic pressure has been shown to cause $T_c$ to increase to as high as 37 K. See S.

Margadonna, et al., "Pressure evolution of low-temperature crystal structure of 37 K $T_c$ FeSe superconductor", arxiv.org/abs/0903.2204, Mar. 12, 2009 (expressly incorporated herein by reference). If the high-pressure phase can be stabilized in thin film form, this material may also be practical for superconducting devices.

Most FeAs superconducting samples heretofore reported are comprised of compressed polycrstalline powders, or of very small single crystals, which are not optimized for electronic applications. However, a superconducting thin film of FeAs compounds prepared by pulsed-laser deposition was very recently reported. See H. Hiramatsu, et al., "Superconductivity in Epitaxial Thin Films of Co-Doped $SrFe_2As_2$ with Bilayered FeAs Structures and their Magnetic Anisotropy", Applied Physics Express, vol. 1, p. 101702, September 2008 (expressly incorporated herein by reference). Pulsed laser deposition was used early in the development of cuprate superconducting materials (see, for example, U.S. Pat. No. 5,290,761), but eventually found to be unsuitable for superconducting device manufacturing due to embedded particulates and difficulties in uniformity and scaling.

SUMMARY OF THE INVENTION

For development of superconducting electronic circuits based on high temperature superconducting Fe compounds, thin films and JJs are required. The fabrication technology of these materials is not yet established, and the present application describes promising fabrication and design approaches based on preliminary reports of material properties.

Preliminary measurements of high temperature superconducting Fe compounds indicate that effects of grain boundaries and anisotropy may be much less significant than for the cuprates. If that is confirmed, a polycrystalline thin-film technology would be preferred, since it would greatly expand the choices of compatible substrates, insulators, and resistive layers. This is in sharp contrast to YBCO and the cuprates, where polycrystalline materials are not technologically useful for electronic applications. A superconducting film (of order 100 nm thick) is grown by physical vapor deposition, preferably by sputtering from a target of similar composition, preferably onto an appropriate substrate heated to a sufficient temperature such that the proper crystal structure grows with the Fe planes largely parallel to the substrate. Such a film should exhibit a high in-plane superconducting current, if grain boundaries and crystalline defects do not substantially weaken the superconductivity.

JJs may be comprised of an SNS sandwich, where S refers to the high temperature superconducting Fe compounds, and N is a normal resistive material that preferably has a crystalline structure and composition compatible with high temperature superconducting Fe compounds, and may also be up to 100 nm thick. The structure maybe be comprised of a vertical trilayer, or alternatively a horizontal ramp-edge with overlapping layers (FIG. 2).

The IC process technology also preferably includes multiple superconducting wiring layers, separated by non-leaky insulators, a resistive layer, and a metallic contact layer (FIG. 3). The insulator layers are comprised of a material that is compatible with the high processing temperatures and will not substantially degrade the high temperature superconducting Fe compounds interfaces. For example, this may be comprised of a rare-earth oxide. The resistive layer should exhibit a resistance of order a few ohms per square, and may be comprised of a similar crystalline structure to high temperature superconducting Fe compounds Fe—As, but with a composition that is resistive at the operating temperature. Alternatively, the resistive layer may be comprised of a compatible intermetallic alloy. The metallic contact layer may be comprised of a metal that is relatively inert in an oxygen atmosphere and forms a low-resistance contact with high temperature superconducting Fe compounds, such as gold or platinum.

As an alternative to a polycrystalline thin-film technology, an epitaxial thin-film technology is proposed. The structures would be similar, except that all substrates and layers (except for the top contact and insulating layers) would be specially selected in order to maintain full crystallinity through the entire stack without defects. For example, the a-b lattice constant of the RFAO and related crystals is about 0.4 nm, matching that of $SrTiO_3$ and related perovskite oxides. Such an insulating crystal may be used as an epitaxial substrate, as well as for inter-layer insulators.

In addition to depositing thin films, microcircuits are patterned, preferably using photolithography. The patterns may be transferred to the films using one or more etch processes, such as argon and reactive-ion beam and plasma etches.

ICs based on high temperature superconducting Fe compound films, fabricated according to the provisions of this application, may comprise ultrafast RSFQ logic circuits operating at temperatures of 50 K or above.

DETAILED DESCRIPTION OF THE PREFERRED EMBODIMENTS

Figure 1A:
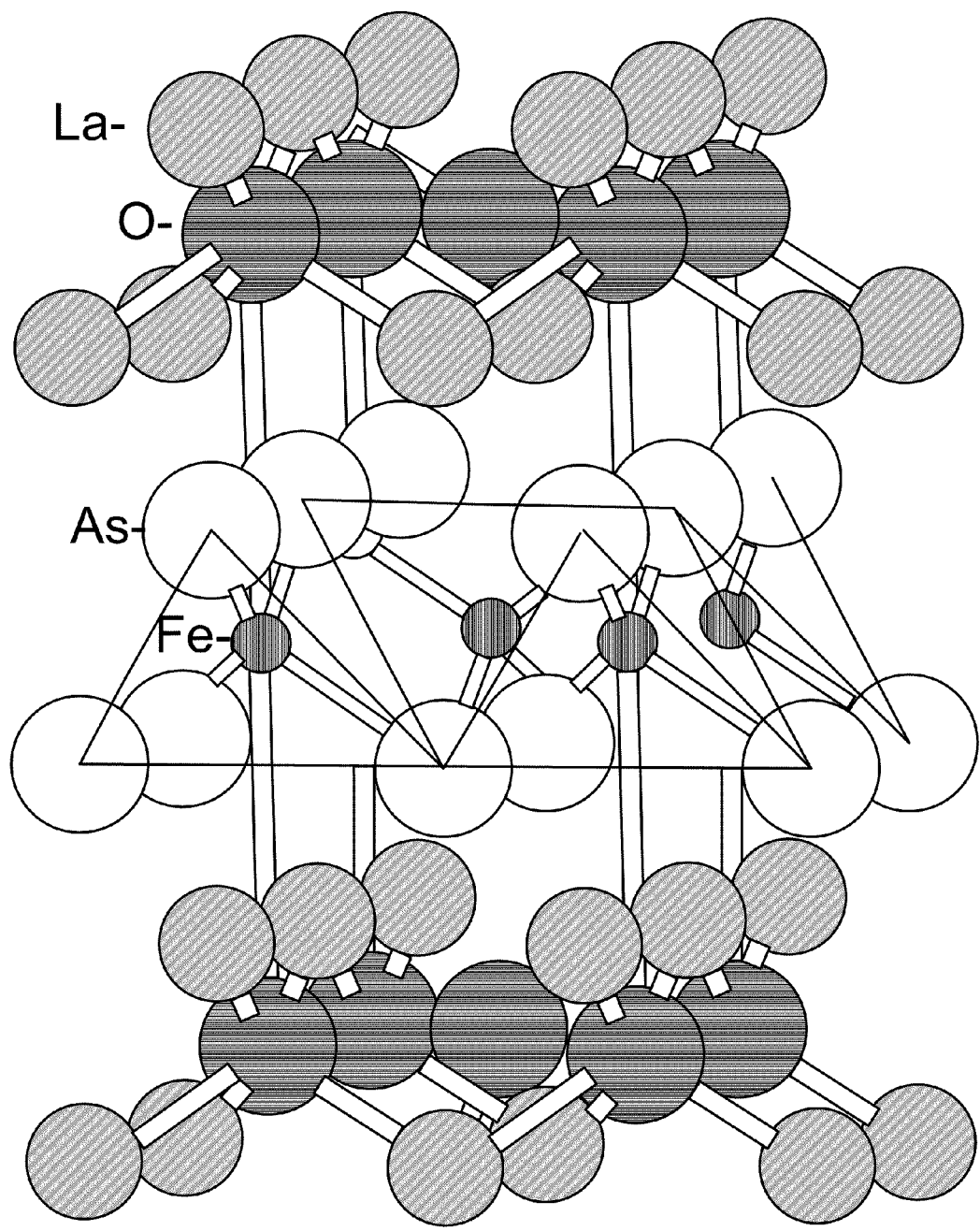
FIG. 1A shows the crystal structure of new layered LaFeAsO superconductors, adapted from Kamihara (2008).

The crystal structure of LaFeAsO in FIG. 1A represents a family of closely related materials, some of which are superconductors at various temperatures. The crystal structure is tetragonal, with lattice constants a=b=0.4 nm and c=0.87 nm, with some variation in lattice parameters for elemental substitutions. The key functional part of this material is the planar network of Fe atoms in the a-b plane, surrounded by As atoms (the Fe—As layer 100 in FIG. 1A). The Fe atoms provide the conduction bands, and also the spin magnetic moments which may order magnetically. The La—O layers 110 are largely inert, but affect the FeAs layers in two major ways: they may "dope" the FeAs with electrons or holes, and they may structurally strain the FeAs layers. The Fe site may be substituted with other transition metal atoms such as Cr, Mn, Co, and Ni (adjacent in the periodic table). The As site may be substituted with P, just above it in the periodic table, or possibly Sb, just below it. Alternatively, chalcogenide atoms Se, Te, or S may be doped onto the As site. The La site may be substituted with another (trivalent) rare-earth atom, where the rare-earths comprise the lanthanide series plus yttrium and scandium. (Alternatively, another trivalent metal atom may be substituted such as Bi or Tl.) For doping purposes, the La site may be substituted in part by alkaline earth (divalent) metals such as Sr, Ca, or Ba. The O site may also be partially substituted for doping purposes, either by monovalent F, or even by a vacancy. Recent reports (Ren et al.) have identified SmFeAsO$_{1-\delta}$ with T$_c$=55 K (here δ represents the fraction of O vacancies), but the optimum composition for superconductivity and for thin films may remain to be identified. In this application, the term "RFAO" represents any superconducting material in this family, where R stands for rare-earth element. Some possible substitutions are summarized in Table 1.

TABLE 1

Lattice sites and atomic substitutions for LaFeAsO and related compounds

| Site | Substitution |
|---|---|
| La | La, Ce, Pr, Nd, Sm, Eu, Gd, Tb, Dy, Ho, Er, Tm, Yb, Lu, Y, Sc, Bi, Tl, Sr, Ca, Ba, Pb |
| Fe | Fe, Cr, Mn, Co, Ni, Ru, Rh, Pd |
| As | As, P, Sb, Se, Te, S |
| O | O, F, N, vacancy |

For deposition of thin films of RFAO, one concern is the high vapor pressure of As at the temperatures of formation of the RFAO compound (600° C. or above). This means that some of the As atoms are likely to boil away from the film, if the film is heated in a vacuum chamber. One way to deal with this problem is to deposit the film at a low or ambient temperature, and then react it subsequently at a higher temperature in a sealed chamber with an overpressure of As atoms. While this approach may be appropriate for a single film of RFAO, it is not compatible with a multilayer process that would be required for an IC process. Alternatively, one may carry out the film deposition at an elevated temperature, within an atmosphere that contains sufficient activated As atoms. For example, one may carry out sputtering in an atmosphere that includes not only the usual argon atoms, but also an arsenic-based gas such as arsine (AsH$_3$) as well as some O$_2$ or H$_2$O. In the presence of the plasma discharge of the sputtering process, reactive As (and O) atoms will be generated and incorporated in the growing film. Furthermore, the composition of the sputtering target will also be stabilized by the reactive As and O atoms. In this way, one may grow a film with the proper composition and crystalline structure even at an elevated substrate temperature of 600° C. or above.

Figure 4:
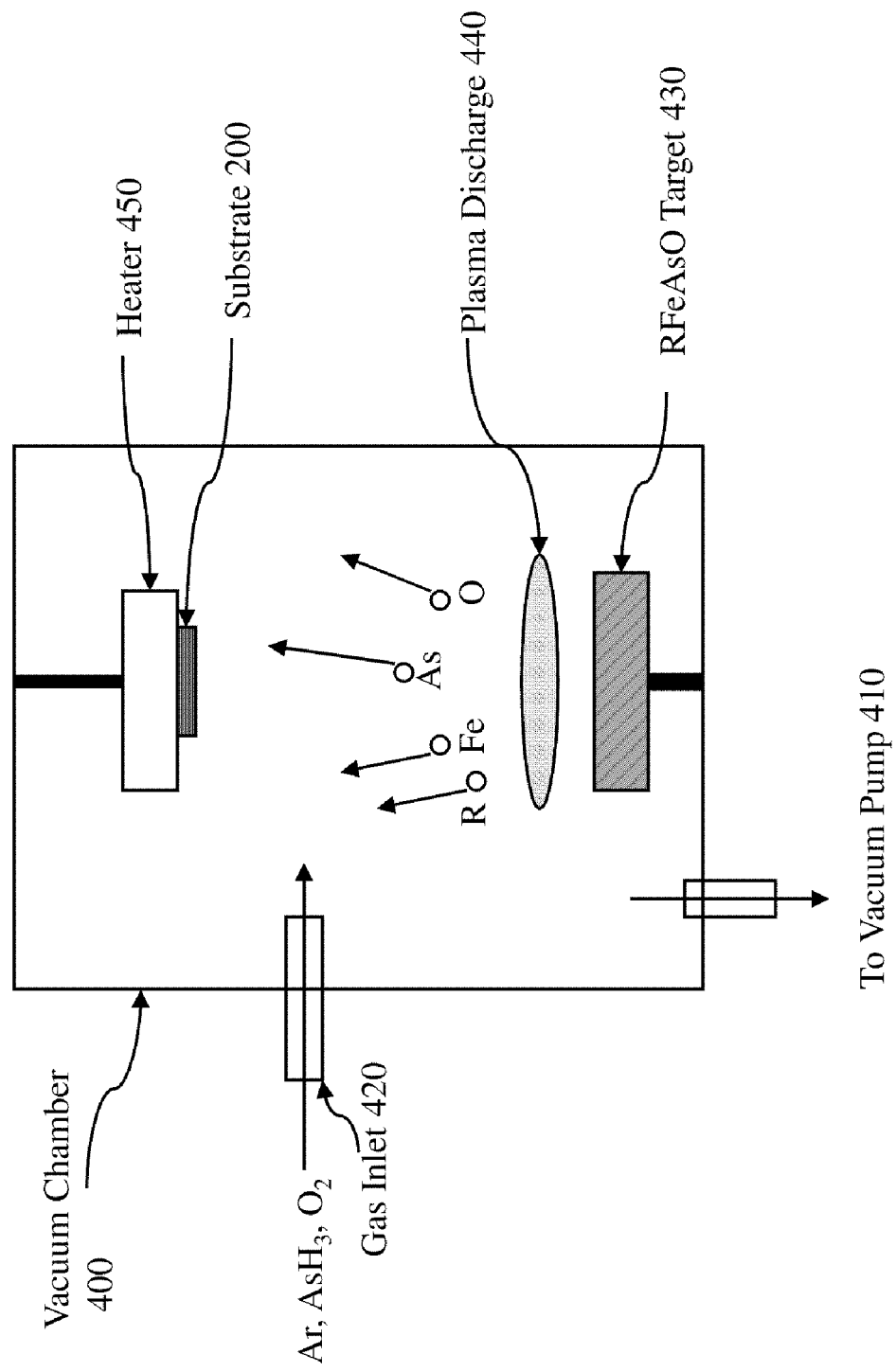
FIG. 4 shows a schematic diagram of sputtering configuration for RFAO deposition, showing sputtering target, heated substrate, and added sputtering gases.

A schematic diagram of this reactive sputtering process is illustrated in FIG. 4. Here a sputtering deposition chamber 400 with a gas inlet port 420 with inert sputtering gas (e.g., Ar) and reactive gases (e.g., O$_2$, and AsH$_3$) is connected to a vacuum pump 410. A solid sputtering target 430, with composition similar to the desired composition of the superconducting film, e.g., RFeAsO (where R is a rare earth metal), is connected to an electrical power supply in accordance with standard sputtering procedures. This induces a plasma discharge 440 adjacent to the target 430, resulting in ionic bombardment of the target and sputtering of various atomic species, that move from the target 430 toward the substrate 200, thus growing a thin film from the vapor phase atoms. The substrate 200 is mounted on a high-temperature heater 450, capable of controlled heating of the substrate to temperatures up to 600° C. and above. Atoms of volatile species (e.g., As) that evaporate from the surface of the growing RFeAsO film may be replaced by atoms created in the plasma discharge by the reactive gas introduced by the gas inlet 420.

Figure 1B:
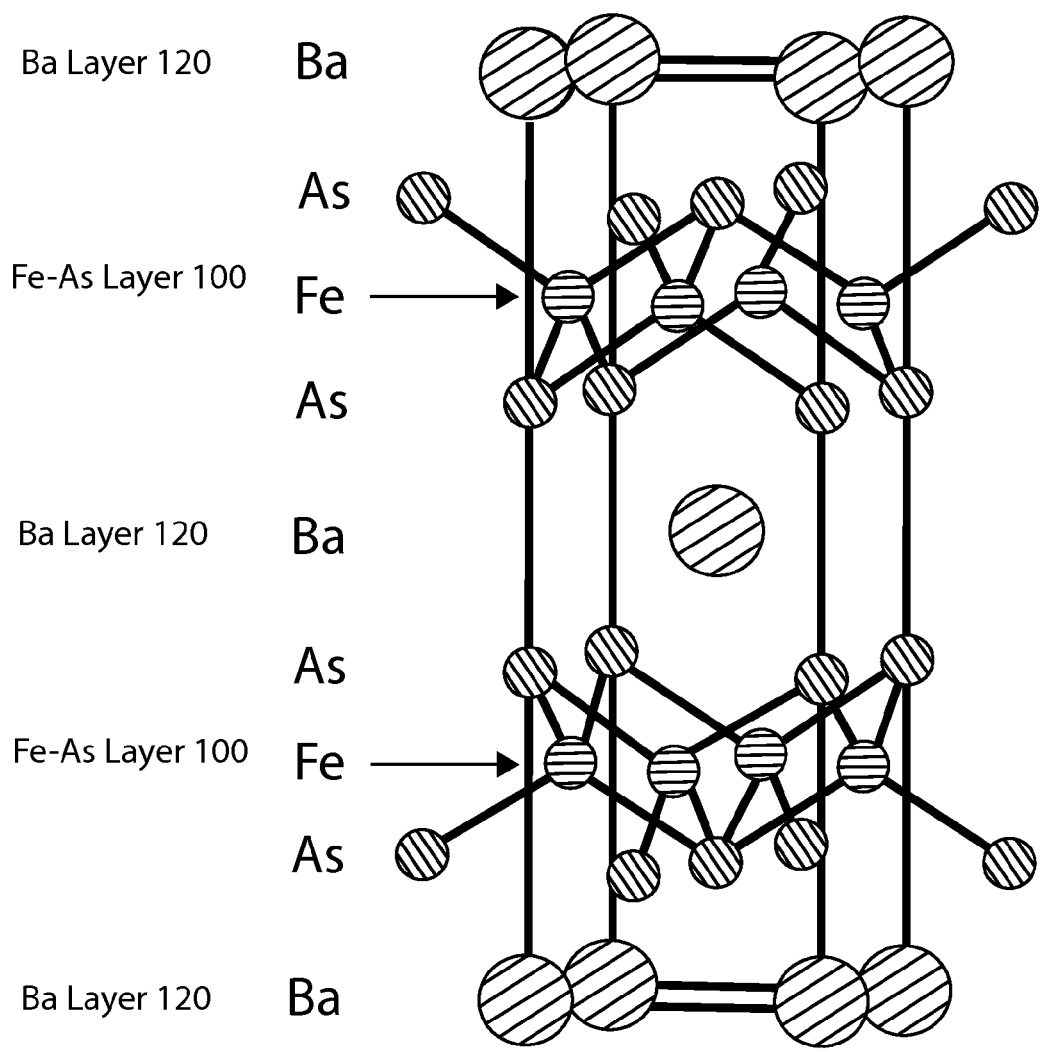
FIG. 1B shows the crystal structure of the layered superconductor based on $BaFe_2As_2$ (the 122 phase), from Rotter (2008).

A similar set of considerations is present for sputter fabrication of 122-FeAs films, with composition that might be Ba$_{0.5}$K$_{0.5}$Fe$_2$As$_2$. As illustrated in FIG. 1B, the structure exhibits Fe—As layers 100 in the a-b plane very similar to those in FIG. 1A, which are separated here by Ba layers 120 (where K can substitute for Ba). In this case, there may be no need for O or F inclusion in the film, but K as well as As has a high vapor pressure at the elevated substrate temperature, tending to lead to depletion of the volatile element. Inclusion of a reactive gas for the alkali metal as well as for the arsenic may be appropriate to obtain proper stoichiometry in the growing film.

One problem in the early development of sputtering techniques for YBCO was the presence of secondary resputtering of the growing film due to bombardment by negative oxygen ions accelerated by the sputtering voltage of the target. The solution to this was an off-axis geometry, whereby the growing film does not directly face the sputtering target (as in FIG. 4), but is somewhat to the side (see, for example, U.S. Pat. No. 5,667,650). This avoids the resputtering problem, at the cost of a reduced rate for thin-film deposition. It is not yet clear whether this effect will be relevant for RFAO and related materials. If so, a similar solution can be devised. On the other hand, if this problem does not present, a direct geometry may be used.

The high temperature superconducting Fe compounds are layered, anistropic compounds, with conductivity and superconductivity being somewhat larger in the a-b plane (parallel to the FeAs layers) than in the c-direction (perpendicular to the FeAs layers). The precise degree of anisotropy has been shown in preliminary measurements to vary from one compound to another, but generally to be smaller than that in the cuprate superconductors such as YBCO. The electrical behavior of random polycrystals is affected by anisotropy as well as by grain boundaries. For comparison, the cuprate superconductor YBCO is also anisotropic, with conducting and superconducting properties preferably in the a-b planes of Cu—O. For YBCO, even an assembly of crystallites aligned with their a-b planes parallel exhibit degraded electrical performance, since the grain boundaries exhibit sharply degraded conduction and superconduction. It is not yet clear the extent to which RFAO grain boundaries will be degraded in optimized polycrystalline samples. However, some preliminary measurements of random polycrystalline RFAO samples indicate a metallic resistivity above T$_c$ of order 100 μΩ-cm, which is several times smaller than that in YBCO under similar conditions.

This suggests that intergrain resistance may be less of a problem for high temperature superconducting Fe compounds, and that properly fabricated polycrystalline samples may be technologically useful. This would be important for both wire and thin-film applications. In that case, the electrical behavior of polycrystalline samples could be improved further if the crystallites were substantially aligned, with the conducting a-b planes mostly parallel. In wires, such alignment can be achieved by mechanical alignment of asymmetric crystallites, followed by recrystallization. In thin films, such alignment would be achieved if full crystalline epitaxial growth, on a matching single-crystal substrate, were employed, but this may not be necessary. It is often the case that growth kinetics tend to favor one crystallite orientation over another. Given the layered structure of the high temperature superconducting Fe compounds, it is likely that sidewards growth kinetics of the layers on a heated substrate will lead to dominance of crystallites with the a-b FeAs planes oriented parallel to the substrate, as desired.

The substrate 200 should be a high-temperature material that is compatible with a layer 210 of high temperature superconducting Fe compounds, without substantial interdiffusion near the interface. Substrates also should preferentially exhibit similar thermal expansion between the deposition temperature and cryogenic temperatures, so that thermal cycling will not lead to stress cracks or delamination. While such parameters have not yet been established for the high temperature superconducting Fe compounds, a high-temperature oxide such as alumina might provide a suitable substrate. If an epitaxial substrate 200 would be required, $SrTiO_3$ has a perovskite unit cell with lattice constant a=0.39 nm, which may be compatible with the high temperature superconducting Fe compounds, and other perovskite materials may also be suitable. Alternatively, an appropriate polycrystalline or epitaxial buffer layer 280 may be deposited between a particular desired substrate 200 and the high temperature superconducting Fe-based film 210.

For active devices in superconducting circuits, Josephson junctions (JJs) are typically employed. While the classic JJ is comprised of an SIS sandwich with a 1-nm-thick insulating tunnel barrier, such a thin insulator would typically not be stable at the high deposition temperatures used to form at least the top layer. An alternative structure is an SNS JJ, where the barrier layer N is a thicker layer of a "normal" resistive metal, but with a thickness (up to about 100 nm) that still permits coupling between the two superconducting electrodes, not much longer than the "superconducting coherence length" (10-100 nm). When sandwiched between two S layers, the N layer is induced into a weak superconducting state, with a maximum zero-resistance current (the critical current $I_c$) of order 1 mA for typical circuit applications. For currents exceeding $I_c$, it preferably exhibits a non-hysteretic resistance $R_n$ of order 1 ohm, for a characteristic voltage $V_c=I_c \times R_n$ of order 1 mV, though characteristic voltages of 100 microvolts or less may still yield useful devices. (This should permit high-speed RSFQ circuits, with clock rates up to ~100 GHz.) The N layer should be comprised of a material that is a compatible substrate for the top layer of the high temperature superconducting Fe compound, without substantial interdiffusion at the interface that would degrade the superconductivity near the surface. The thickness could be 10-100 nm, depending on the resistivity of the N material (which should be >100 $\mu\Omega$-cm). An acceptable N material might include an oxide or ceramic conductor that has the same crystalline structure as the high temperature superconducting Fe compounds, but is not (by itself) superconducting at the projected operating temperatures. An example might be LaNiAsO, which was recently shown to be superconducting but only below 4 K. In this case, one can be assured that the top Fe layer of the high temperature superconducting Fe compound will have high crystalline quality near the interface, since it will grow epitaxially. For an optimum JJ, good superconducting properties are provided at the upper surface of the lower electrode and the lower surface of the upper electrode.

Figure 2A:
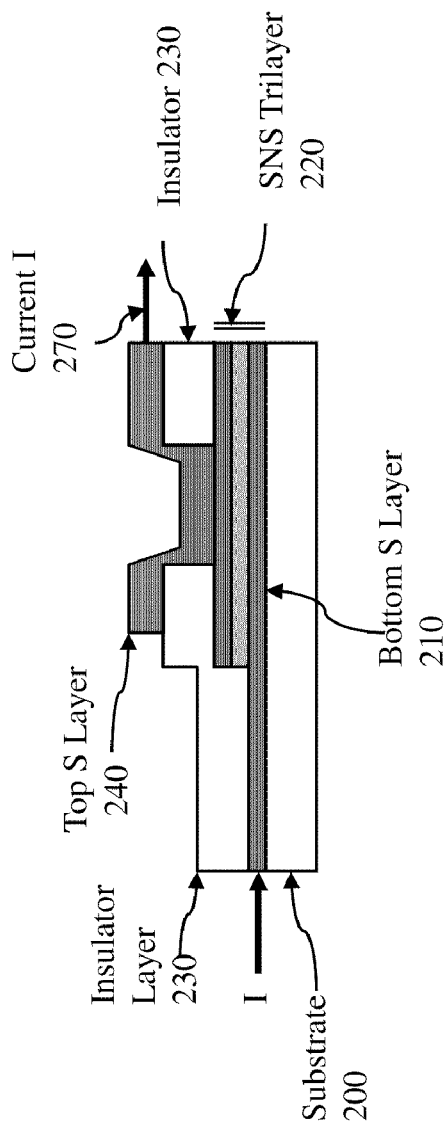
FIGS. 2A and 2B show structures of SNS Josephson junctions using new superconductors, showing vertical sandwich structure, and horizontal ramp-edge structure, respectively.
Figure 2B:
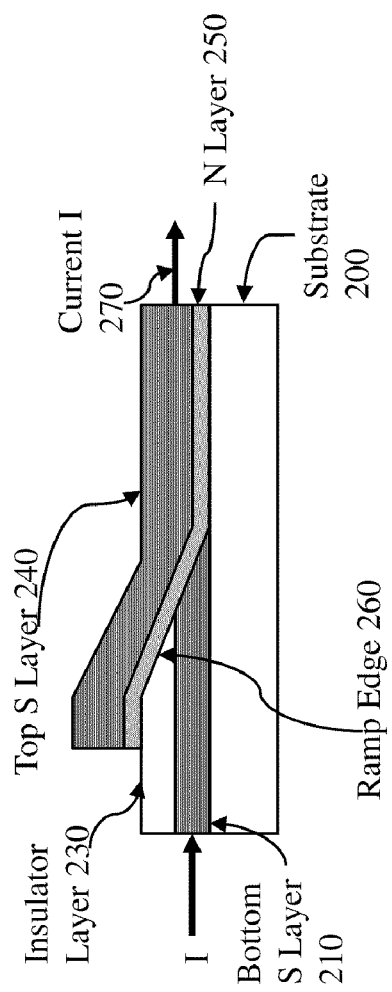

As illustrated in FIGS. 2A and 2B, two alternative SNS junction geometries are proposed. The first geometry in FIG. 2A is a vertical sandwich geometry, where the SNS trilayer 220 is sequentially deposited without opening the vacuum chamber (the substrate must be transported between the two sources). This will lead to a clean, efficient process. On the other hand, it will involve supercurrent flow in the unfavorable direction. If the superconductivity is found to be too anisotropic, this might present a problem. An alternative geometry is illustrated in FIG. 2B, where the bottom S electrode is removed from the vacuum chamber and patterned into a ramp geometry by ion-beam etching at a glancing angle (described further below). Then the sample can be re-inserted into the vacuum chamber, where the N and top S electrodes are deposited. For the highly anisotropic case, this will couple horizontal current flow along the FeAs planes between the two electrodes. It does require an additional processing step, which might damage the top surface of the lower electrode, unless special precautions (or appropriate re-annealing) are carried out.

In more detail, FIG. 2A illustrates a sequence of processes, whereby a superconducting base electrode is first deposited on the substrate 200, followed by deposition of the N barrier layer and a thin superconducting counter-electrode, which together comprise the SNS trilayer sandwich 220. The substrate with SNS trilayer is then removed from the deposition system and patterned (e.g., by etching) into a ground wiring layer, the bottom S layer 210 in FIG. 2A. In those areas where Josephson junctions are intended to be formed, the full SNS trilayer is maintained. In this way, the interfaces between S and N layers should be clean and ideal. The substrate is then introduced into a vacuum system, and an appropriate insulator layer 230 is deposited on the patterned superconductor film. This is then patterned (by, e.g., etching) to expose only those regions that will become Josephson junctions. Finally, a top superconducting layer 240 is deposited, designed to form the top wiring layer of the junction. This is then removed from the vacuum chamber and patterned with the appropriate wiring geometry. As shown in FIG. 2A, the current I (270) in the resulting device flows parallel to the substrate 200 in layers 210 and 240, but perpendicular to the substrate through the N layer of the SNS trilayer 220. Such a vertical geometry may be preferred for simplicity of fabrication, but may exhibit non-ideal Josephson junction performance if the superconducting material is too anisotropic.

Although the anisotropy of the Fe-based superconductors generally appears reduced relative to that in most of the cuprate high-temperature superconductors, an alternative Josephson junction fabrication technique is presented that may be preferable for high-anisotropy cases, as shown in FIG. 2B. In contrast to FIG. 2A, where the three layers of the SNS trilayer 220 are deposited without breaking vacuum, FIG. 2B presents a method whereby the bottom S layer 210 is deposited first, then the insulator layer 230 is deposited. The sample is then removed from the vacuum system and a resist pattern is deposited on the film, followed by etching at an angle to produce ramp edge 260. The resist pattern is then removed, the sample is reintroduced to the vacuum chamber, and the upper surface of the film (including the ramp edge 260) is cleaned in situ via a plasma cleaning method to remove any remaining patterning residue. Finally, the N layer 250 and top S layer 240 are deposited on top of the ramp edge 260 (and parts of the insulator layer 230) to define the junction area. Note that the current flow 1270 in this geometry lies essentially parallel to the substrate 200 not only in the top and bottom electrodes 210 and 240, but also in the junction area near the ramp edge 260 as well. To the extend that vertical current flow may be difficult in an anisotropic material, this geometry substantially reduces that difficulty.

As an alternative approach to depositing a separate N layer 250 for the barrier layer of the Josephson junction, one could create a modified interface by introducing an alternative processing gas into the deposition chamber. For example, if the film is comprised of a 122 phase without oxygen (such as $Ba_{1-x}K_xFe_2As_2$), the deposition could be halted and oxygen could be introduced into the chamber at an appropriate pressure to create a slightly disordered structure over an intermediate layer. The oxygen could then be pumped out and the superconductor film deposition started again, to form the upper superconducting layer of the trilayer sandwich.

Figure 3:
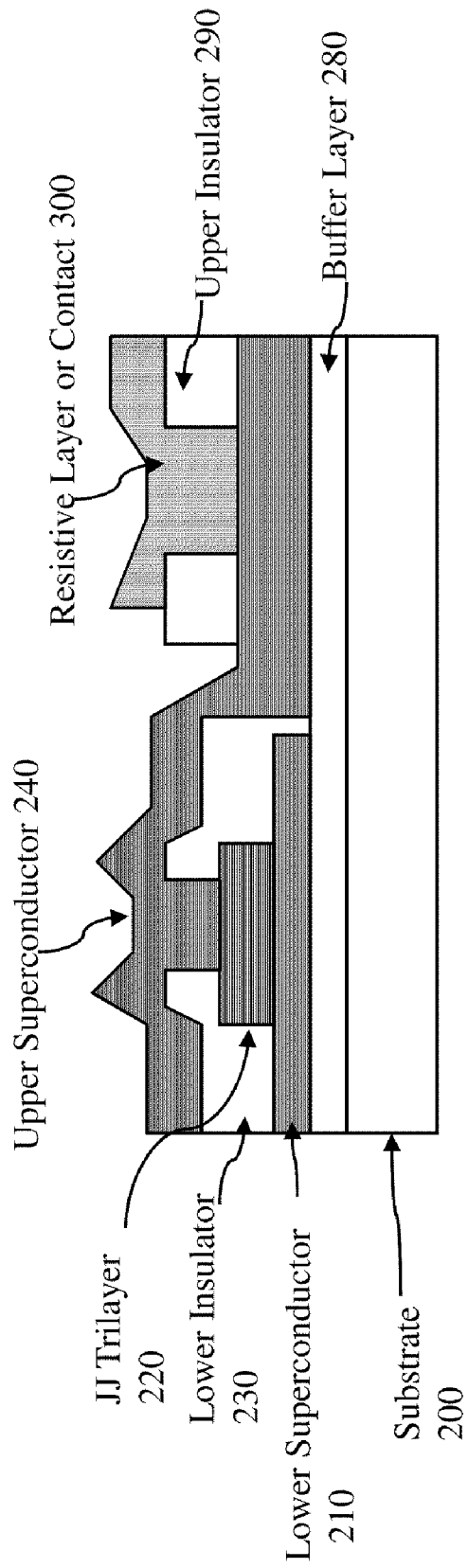
FIG. 3 shows multilayer process for superconducting ICs, showing multiple superconducting layers, insulating layers, resistor layer, JJ trilayer, and patterned lines and vias.

Of course, for an integrated circuit process, one needs more than simply a Josephson junction trilayer. A conceptual picture for a 7-layer process with patterned lines and vias is illustrated in FIG. 3. This is for a non-planarized process, which should be acceptable if edge coverage is good. A planarized process would enable additional patterned layers in the vertical stack. The process steps are listed in Table 2; the SNS trilayer deposition is counted here as a single step. This could be easily extended to additional wiring and insulator layers if desired.

TABLE 2

Process Steps for RFAO-based IC Technology

1) Deposit Insulating Buffer Layer 280 on Substrate 200 (optional)
2) Deposit/Pattern Lower Superconductor Layer 210
3) Deposit/Pattern SNS JJ Trilayer 220
4) Deposit/Pattern Lower Insulator Layer 230
5) Deposit/Pattern Upper Superconductor Layer 240
6) Deposit/Pattern Upper Insulator Layer 290
7) Deposit/Pattern Resistor or Contact Layer 300

Any practical IC process requires multiple wiring layers, as shown in FIG. 3. For ultrafast voltage pulses in superconducting circuits, such interconnects must also be superconducting. Where such layers cross each other, it is essential that they not short to one another. So a reliable insulating layer 230 must serve as a substrate for the upper superconducting layer 240, while also withstanding thermal cycling between the hot fabrication temperature and the cold operating temperature. For the polycrystalline process, one of the rare-earth oxides such as $La_2O_3$ may be compatible with FeAs or other high temperature superconducting Fe compound; for the epitaxial process, a perovskite oxide such as $SrTiO_3$ may be used.

For RSFQ circuits, a resistive layer 300 with a controlled sheet resistance of a few ohms per square is provided. This is used for resistor trees for precise bias current distribution, and may also be needed for controlled damping resistors. The length of the line is much longer than the superconducting coherence length, so no supercurrents are coupled. The film thickness might be 10-100 nm, corresponding to a moderate metallic resistivity ~10 $\mu\Omega$-cm, much lower than that for the N layer of the SNS junction. If the resistive layer is above all the superconducting layers, it need not be epitaxial. In that case, a metallic alloy that is compatible with high processing temperatures and resistant to oxidation, such as PtIr, might be appropriate. If it needs to be epitaxial, an alternative high temperature Fe-based superconducting material in a different doping regime might be acceptable.

Finally, any superconducting electronics circuit needs to interface with conventional non-superconducting electronics, which requires normal metal contacts with low contact resistance to the high temperature superconducting Fe compound, and which can be contacted or soldered to conventional metallic wires. As the top layer, there is no requirement of epitaxy, but resistance to oxidation is important. Appropriate metals may include Au and Pt. This may comprise the same resistor layer 300 shown in FIG. 3, or alternatively a separate layer may be deposited and patterned.

A summary of the materials for the various layers in the proposed polycrystalline and epitaxial processes for high temperature Fe-based superconducting ICs are presented in Table 3.

TABLE 3 materials in poly and epi IC processes for RFAO superconductors

|  | Poly | Epi |
| --- | --- | --- |
| Substrate | Alumina | $SrTiO_3$ |
| Superconductor | RFAO or $BaFe_2As_2$ | RFAO or $BaFe_2As_2$ |
| Junction Barrier | LaNiAsO | LaNiAsO |
| Insulator | Rare-earth oxide | $SrTiO_3$ |
| Resistor | PtIr | LaNiAsO |
| Contact | Au, Pt | Au, Pt |

Finally, various IC technologies have sets of microlithography processes to define lines and holes in layers and vias between layers. These processes are generally comprised of mask transfer and etching steps for each deposited layer. The mask transfer may be comprised of photolithography (typically optical projection systems in the ultraviolet), or direct-write using focused electron or ion beams. These conventional techniques may also be used for high temperature superconducting Fe compounds IC fabrication. Dry etching may be carried out using Ar ion beam or plasma discharge processes, which will etch any of the materials with little distinction. This requires careful calibration and timing of etch rates, so that the etch may stop at the appropriate layer. Alternatively, an appropriate set of reactive ion etch processes may be developed, using plasma discharges of reactive species that will selectively remove a given layer and stop at the next one. A reactive etch that is selective for high temperature superconducting Fe compounds and related materials has not yet been defined, but is not essential for initial technology development.

The only somewhat non-standard etching process is the one to define ramp-edge JJs, the alternative JJ structure in FIG. 2B, if, for example, the properties of the simpler sandwich structure in FIG. 2A prove to be insufficient. This requires definition of a ramp edge 260 at some angle, such as 45 degrees, and a highly directional atomic beam, such as accelerated and neutralized argon ions. Such a beam is well known in the prior art, and the beam would be directed at the sample rotated at the appropriate glancing angle, after the required etching mask has been defined by microlithography.

While this specification has focused on integrated circuits based primarily on the new iron-based superconductor, one may also envision hybrid circuits that combine layers of different superconducting materials families. For example, one might fabricate an epitaxial superconducting layer of YBCO according to established recipes, and use this as a substrate for sequential deposition of Fe-based superconducting films and junctions. Such a hybrid system would be expected to operate at a temperature reflecting the lesser value of the critical temperature of the component superconducting materials. However, such a hybrid system might exhibit advantages in terms of device performance, ease of fabrication, or device yield. The devices according to the present invention may be used for a variety of purposes. Preferably, they may be fabricated into analog-to-digital converters, digital-to-analog converters, RSFQ logic devices, digital correlators, digital switch matrices, decimators, amplifiers, analog and digital filters, superconducting quantum interference devices (SQUIDs), Josephson voltage standards, optical communication interface devices, radio-frequency communication devices (transmitters, receivers, transceivers) and the like.

INDEX OF FIGURE LABELS

100 Fe—As Layer
110 La—O Layer

120 Ba Layer
200 Substrate
210 Lower Superconductor Layer
220 Josephson Junction Trilayer
230 Lower Insulator Layer
240 Upper Superconductor Layer
250 Junction Normal Layer (N)
260 Ramp Edge
270 Junction Current I
280 Buffer Layer
290 Upper Insulator Layor
300 Resistor or Contact Layer
400 Deposition Vacuum Chamber
410 Vacuum Pump Port
420 Gas Inlet
430 Superconductor RFeAsO Target
440 Sputtering Plasma Discharge
450 Substrate Heater

What is claimed is:

1. A Josephson junction superconducting device, comprising a first superconducting layer, a second superconducting layer, and an intermediate layer which weakly couples a superconductivity between the first and second layers, wherein at least one of the superconducting layers is an Iron-based high temperature superconductor.

2. The Josephson junction superconducting device of claim 1, where all three layers are deposited sequentially in a vacuum system without breaking vacuum.

3. The Josephson junction superconducting device of claim 1, in which at least one of the superconductor layers is polycrystalline.

4. The Josephson junction superconducting device of claim 1, in which at least the Iron-based high temperature superconductor is polycrystalline.

5. The Josephson junction superconducting device of claim 1, in which at least one of the superconductor layers is epitaxial.

6. The Josephson junction superconducting device of claim 1, in which at least one of the superconductor layers is a composition comprising Iron and Arsenic.

7. The Josephson junction superconducting device of claim 1, in which at least one of the superconductor layers is a composition comprising Iron and Selenium.

8. The Josephson junction superconducting device of claim 1, in which the first superconductor layer differs in composition from the second superconductor layer.

9. A method for forming a superconducting device on a substrate, comprising:
   1) depositing a lower interconnect layer on a substrate surface;
   2) depositing and patterning a superconductor-barrier-superconductor Josephson junction trilayer, wherein at least one of the superconductor layers of the Josephson junction trilayer is an iron-based superconductor;
   3) depositing and patterning a lower insulator layer; and
   4) depositing an upper interconnect layer.

10. The method according to claim 9, wherein the lower interconnect layer and the upper interconnect layer are each patterned.

11. The method according to claim 9, further comprising depositing and patterning an upper insulator layer over the upper interconnect layer, and depositing and patterning a resistor or contact layer over the upper insulator layer.

12. The method according to claim 9, further comprising the step of etching at least one superconductor layer of the Josephson junction trilayer such that a resulting layer surface is not parallel to the substrate.

13. The method according to claim 9, wherein the lower interconnect layer and upper interconnect layer each comprise patterned iron-based superconductor compounds.

14. The method according to claim 9, wherein the superconducting device has a critical temperature of greater than about 30K.

15. The method according to claim 9, wherein the superconducting device is configured as a superconducting integrated circuit having a plurality of interconnected Josephson junctions having a critical temperature of greater than about 30K, further comprising operating the superconducting integrated circuit at a temperature below the critical temperature.

16. A method for producing an Fe-based superconducting thin film on a substrate, wherein sputtering of a solid target is used in combination with at least one reactive gas; wherein the Fe-based superconducting thin film comprises a volatile constituent as a necessary component, further comprising heating the substrate to a temperature which causes a volatilization of the volatile constituent, and surrounding the heated substrate with an atmosphere containing a sufficient amount of volatile constituent to maintain a superconducting nature of the Fe-based superconducting thin film, and the volatile constituent comprises As.

* * * * *